US008906739B2

United States Patent
Ohta et al.

(10) Patent No.: US 8,906,739 B2
(45) Date of Patent: Dec. 9, 2014

(54) THIN FILM TRANSISTOR SUBSTRATE AND METHOD FOR MANUFACTURING SAME

(75) Inventors: Yoshifumi Ohta, Osaka (JP); Yoshimasa Chikama, Osaka (JP); Masahiko Suzuki, Osaka (JP); Okifumi Nakagawa, Osaka (JP); Yoshiyuki Harumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 80 days.

(21) Appl. No.: 13/582,773

(22) PCT Filed: Feb. 9, 2011

(86) PCT No.: PCT/JP2011/000735
§ 371 (c)(1),
(2), (4) Date: Sep. 5, 2012

(87) PCT Pub. No.: WO2011/125275
PCT Pub. Date: Oct. 13, 2011

(65) Prior Publication Data
US 2012/0326144 A1  Dec. 27, 2012

(30) Foreign Application Priority Data
Apr. 6, 2010 (JP) ................. 2010-087931

(51) Int. Cl.
| H01L 21/336 | (2006.01) |
| H01L 29/786 | (2006.01) |
| H01L 29/66 | (2006.01) |
| H01L 29/49 | (2006.01) |
| H01L 29/45 | (2006.01) |
| H01L 21/02 | (2006.01) |
| H01L 21/477 | (2006.01) |

(52) U.S. Cl.
CPC ...... *H01L 21/02554* (2013.01); *H01L 29/7869* (2013.01); *H01L 29/66742* (2013.01); *H01L 29/4908* (2013.01); *H01L 29/45* (2013.01); *H01L 21/02565* (2013.01); *H01L 21/477* (2013.01); *H01L 21/02617* (2013.01)
USPC ................. 438/104; 438/30; 438/43; 438/99; 438/158

(58) Field of Classification Search
USPC ......... 257/43, E21.411, E29.273; 438/30, 43, 438/99, 104, 158
See application file for complete search history.

(56) References Cited

U.S. PATENT DOCUMENTS 8,017,513 B2 * 9/2011 Jeong et al. .................... 438/604
8,129,719 B2 * 3/2012 Yamazaki et al. .............. 257/43
(Continued)

FOREIGN PATENT DOCUMENTS

JP    2006-165531 A    6/2006
JP    2009-099953 A    5/2009
(Continued)

OTHER PUBLICATIONS

Official Communication issued in International Patent Application No. PCT/JP2011/000735, mailed on Apr. 26, 2011.

*Primary Examiner* — S. V. Clark
*Assistant Examiner* — Monica D Harrison
(74) *Attorney, Agent, or Firm* — Keating & Bennett, LLP

(57) ABSTRACT

A method includes: a step of forming a gate electrode (14) on a substrate (10a); a step of forming a gate insulating film (15) to cover the gate electrode (14), and then forming an In-Ga-Zn-O-based oxide semiconductor layer (16) in which a ratio of In:Ga:Zn in atomic % is 1:1:1 or 4:5:1 on the gate insulating film (15) to overlap the gate electrode (14); a step of forming a source electrode (19a) and a drain electrode (19b) on the oxide semiconductor layer (16) to overlap the gate electrode (14) and to face each other; and a step of performing an annealing process in an atmosphere containing steam (S) on the substrate (10a) provided with the source electrode (19a) and the drain electrode (19b).

8 Claims, 8 Drawing Sheets

(56) References Cited

U.S. PATENT DOCUMENTS

| | | | |
|---|---|---|---|
| 2005/0070055 A1* | 3/2005 | Kunii | 438/151 |
| 2006/0110867 A1 | 5/2006 | Yabuta et al. | |
| 2010/0203673 A1* | 8/2010 | Hayashi et al. | 438/104 |
| 2010/0267198 A1 | 10/2010 | Yabuta et al. | |
| 2010/0320459 A1 | 12/2010 | Umeda et al. | |

FOREIGN PATENT DOCUMENTS

| | | |
|---|---|---|
| JP | 4415062 B1 | 2/2010 |
| JP | 2011-003856 A | 1/2011 |

* cited by examiner

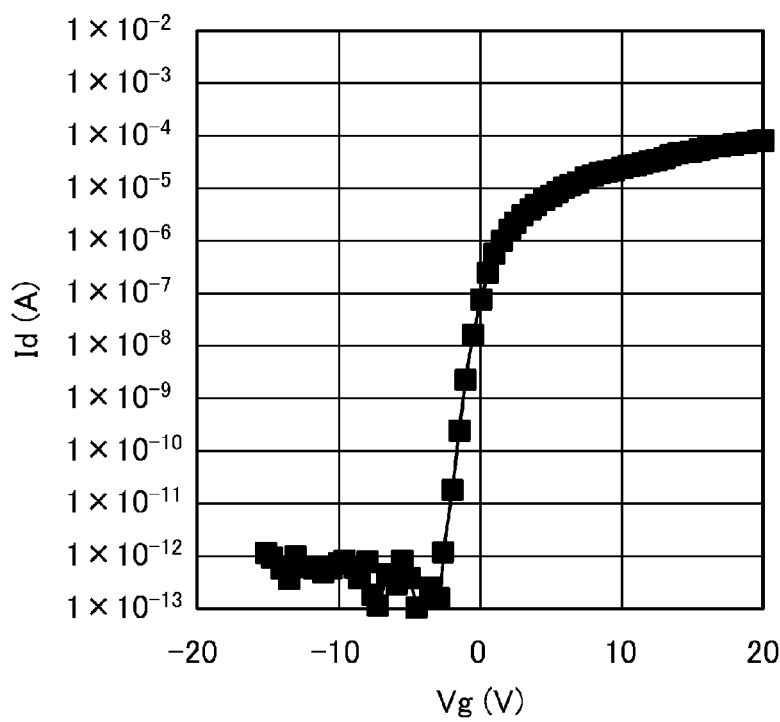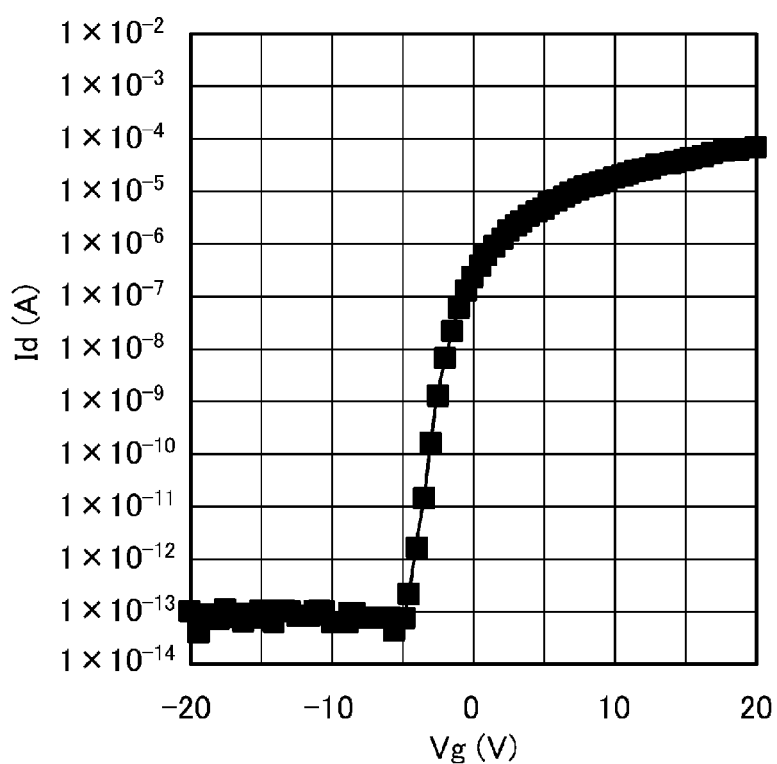

THIN FILM TRANSISTOR SUBSTRATE AND METHOD FOR MANUFACTURING SAME

TECHNICAL FIELD

The present invention relates to thin film transistor substrates and methods for fabricating the same, and specifically to a thin film transistor substrate including a thin film transistor using a semiconductor layer made of an oxide semiconductor and a method for fabricating the same.

BACKGROUND ART

In recent years, in thin film transistor substrates included in, for example, liquid crystal display panels, as switching elements of pixels each of which is a minimum unit for forming an image, thin film transistors (hereinafter referred to as "TFTs") which use semiconductor layers made of an oxide semiconductor (hereinafter also referred to as "oxide semiconductor layers") and have satisfactory characteristics such as high mobility, high reliability, and low off currents have been proposed instead of conventional TFTs using semiconductor layers made of amorphous silicon.

For example, Patent Document 1 discloses methods for fabricating a field effect transistor, wherein the methods include: a (first) method in which before forming an active layer containing amorphous oxide on a substrate, irradiating a surface of the substrate with ultraviolet light in an ozone atmosphere, irradiating the surface of the substrate with plasma, or cleaning the surface of the substrate with a chemical solution containing hydrogen peroxide is performed; a (second) method in which the forming the active layer is performed in an atmosphere containing at least any of ozone gas, nitrogen oxide gas, oxygen-containing radicals, atomic oxygen, oxygen ions, or oxygen radicals; a (third) method in which after the forming the active layer, a thermal treatment at a temperature higher than a film formation temperature of the active layer, or irradiating the substrate provided with the active layer with oxygen plasma is performed; a (fourth) method in which the forming the active layer is performed by resistance heating evaporation, electron beam evaporation, chemical vapor deposition, line beam laser evaporation, or electrodeposition; and a (fifth) method in which the forming the active layer is performed at a film formation temperature higher than or equal to 70° C.

CITATION LIST

Patent Document

PATENT DOCUMENT 1: Japanese Patent Publication No. 2006-165531

SUMMARY OF THE INVENTION

Technical Problem

Now, TFTs which use oxide semiconductor layers and have bottom gate structures each include, for example, a gate electrode provided on a glass substrate, a gate insulating film provided to cover the gate electrode, an oxide semiconductor layer provided on the gate insulating film to overlap the gate electrode in an island-like pattern, and a source electrode and a drain electrode provided on the oxide semiconductor layer to overlap the gate electrode and to face each other. In regard to fabrication of TFTs which use semiconductor layers made of amorphous silicon and have bottom gate structures, channel etch-type TFTs are advantageous over etch stopper-type TFTs in terms of fabrication cost because the channel etch-type TFTs use less number of photomasks than the etch stopper-type TFTs. Thus, TFTs using oxide semiconductor layers are also required to be channel etch-type TFTs.

Here, channel etch-type TFTs using oxide semiconductor layers are more likely to have oxygen deficiencies caused by changes in film composition (stoichiometry) of the oxide semiconductor layers due to desorption of oxygen from the oxide semiconductor layers in fabrication processes of the channel etch-type TFTs. This may increase off currents, reduce electron mobility, cause hysteresis, etc., thereby degrading characteristics of the TFTs. Thus, it is difficult in TFT substrates including channel etch-type TFTs using oxide semiconductor layers to stably form the TFTs to have satisfactory characteristics.

Thus, since desorption of oxygen from oxide semiconductor layers of the channel etch-type TFTs using the oxide semiconductor layers is caused by, for example, channel etching to form source electrodes and drain electrodes, the inventors of the present invention determined that it is effective to perform an annealing process after forming the TFTs on a substrate similar to, for example, the third method disclosed in Patent Document 1 to finally control the amount of oxygen in the oxide semiconductor layers, and studied a method in which the annealing process is performed as postprocessing.

However, in the annealing process disclosed in Patent Document 1, a thermal treatment is performed at a temperature higher than a film formation temperature of the oxide semiconductor layer, and thus hydrogen diffuses from an underlying gate insulating film (in particular, in the case of an underlying gate insulating film made of a silicon nitride film) into the oxide semiconductor layer, and the oxide semiconductor layer is reduced, which may degrade the characteristics of the TFT, or when a source line, a source electrode, and a drain electrode are made of a low resistance interconnect material such as copper, the source line, the source electrode, and the drain electrode are oxidized in the annealing process, thereby increasing electrical resistance. There is room for improvement by reducing the degradation of the characteristics of the TFT and by reducing the electrical resistance. Patent Document 1 at least discloses that a thermal treatment is performed in a steam-containing atmosphere, but fails to disclose detailed fabrication conditions. Note that the present inventors studied a steam annealing process, which is an annealing process performed in a steam-containing atmosphere, for channel etch-type TFTs using In—Ga—Zn—O-based oxide semiconductor layers, and found that the steam annealing process is not generally effective, but there are certain compositions of the oxide semiconductor layers which render the steam annealing process effective. In view of the foregoing, the present invention was devised. It is an objective of the invention to stably obtain satisfactory characteristics of a channel etch-type TFT using an oxide semiconductor layer.

Solution to the Problem

To achieve the above objective, in the present invention, a steam annealing process is performed on an In—Ga—Zn—O-based oxide semiconductor layer having a predetermined composition.

A method for fabricating a thin film transistor substrate, the method comprising: a gate formation step of forming a gate electrode on a substrate; an oxide semiconductor layer formation step of forming a gate insulating film to cover the gate electrode, and then forming an In—Ga—Zn—O-based oxide semiconductor layer on the gate insulating film to overlap the gate electrode; and a source/drain formation step of forming a source electrode and a drain electrode on the oxide semiconductor layer to overlap the gate electrode and to face each other, wherein in the oxide semiconductor layer formation step, the oxide semiconductor layer in which a ratio of In:Ga:Zn in atomic % is 1:1:1 or 4:5:1 is formed, and the method further includes, after the source/drain formation step, a steam annealing step of performing an annealing process in a steam-containing atmosphere on the substrate provided with the source electrode and the drain electrode.

With this method, in the oxide semiconductor layer formation step, the oxide semiconductor layer in which a ratio of In:Ga:Zn in atomic % is 1:1:1 or 4:5:1 is formed, and then in the source/drain formation step, channel etching is performed to form the source electrode and the drain electrode. During the channel etching, a surface layer of the oxide semiconductor layer formed in the oxide semiconductor layer formation step is etched. Thus, oxygen of the channel region of the oxide semiconductor layer is desorbed, thereby causing oxygen deficiencies. However, in the steam annealing step, an annealing process in a steam-containing atmosphere (a steam annealing process) is performed, so that oxygen is supplied to the channel region of the oxide semiconductor layer, thereby repairing the oxygen deficiencies in the oxide semiconductor layer. Here, since the steam annealing process has higher oxidizing power than an annealing process in an air atmosphere, a low process temperature and/or a short processing time suffice(s), which reduces reduction reaction involving the oxygen deficiencies in the oxide semiconductor layer due to the gate insulating film. This reduces a defect level due to the oxygen deficiencies in the oxide semiconductor layer. Thus, it is possible to stably obtain satisfactory characteristics of the channel etch-type TFT using the oxide semiconductor layer.

The method may further include a protective film formation step of forming a protective film to cover the oxide semiconductor layer exposed from the source electrode and the drain electrode, wherein at least part of the protective film facing the oxide semiconductor layer is made of a silicon oxide film, and the steam annealing step is performed after the protective film formation step.

With this method, in the protective film formation step, the protective film is formed to cover the oxide semiconductor layer exposed from the source electrode and the drain electrode (a channel region), wherein at least part of the protective film facing the oxide semiconductor layer is made of a silicon oxide film. Thus, oxygen of the channel region of the oxide semiconductor layer may be desorbed due to chemical vapor deposition (CVD) in forming the protective film. However, the steam annealing step is performed after the protective film formation step, so that the oxygen deficiencies in the oxide semiconductor layer are effectively repaired. Here, the silicon oxide film used as the protective film generally has higher oxygen permeability than a silicon nitride film, and thus oxygen of the steam annealing process is effectively supplied to the channel region of the oxide semiconductor layer. Moreover, the at least part of the protective film facing the silicon oxide layer is made of an oxide semiconductor film. Thus, for example, the oxygen deficiencies in the oxide semiconductor layer, which may be caused in the case of the silicon nitride film due to desorption of hydrogen in the silicon nitride film, can be reduced.

In the oxide semiconductor layer formation step, at least part of the gate insulating film facing the oxide semiconductor layer may be made of a silicon oxide film.

With this method, the gate insulating film is formed in the oxide semiconductor layer formation step, and at least part of the gate insulating film facing the oxide semiconductor layer is made of a silicon oxide film. Thus, for example, the oxygen deficiencies in the oxide semiconductor layer, which may be caused in the case of the silicon nitride film due to desorption of hydrogen in the silicon nitride film, can be reduced.

The steam annealing step may be performed under atmospheric pressure.

With this method, the steam annealing process is performed under atmospheric pressure, so that desorption of oxygen due to ambient pressure in performing the steam annealing process is reduced.

The steam annealing step may be performed at a temperature lower than or equal to a film formation temperature of the oxide semiconductor layer.

With this method, the steam annealing process is performed at a temperature lower than or equal to the film formation temperature of the oxide semiconductor layer. Thus, reduction reaction involving the oxygen deficiencies in the oxide semiconductor layer due to the gate insulating film is reduced.

In the steam annealing step, the annealing process may be performed such that an oxygen filling rate of the oxide semiconductor layer is greater than or equal to 87%, the oxygen filling rate being given by an expression: ([atomic % of In]× 3/2+[atomic % of Ga]×3/2+[atomic % of Zn])/[atomic % of O].

With this method, in the steam annealing step, the annealing process is performed such that the oxygen filling rate of the oxide semiconductor layer is greater than or equal to 87%. Thus, the oxygen deficiencies in the oxide semiconductor layer are specifically repaired. Note that when the steam annealing is not performed, the oxygen filling rate of the oxide semiconductor layer is less than 87%, and characteristics of TFT may be degraded.

A thin film transistor substrate according to the present invention includes a thin film transistor provided on a substrate, wherein the thin film transistor includes a gate electrode provided on the substrate; a gate insulating film provided to cover the gate electrode; an In—Ga—Zn—O-based oxide semiconductor layer provided on the gate insulating film to overlap the gate electrode; and a source electrode and a drain electrode provided on the oxide semiconductor layer to overlap the gate electrode and to face each other, a ratio of In:Ga:Zn in atomic % in the oxide semiconductor layer is 1:1:1 or 4:5:1, and an oxygen filling rate of the oxide semiconductor layer is greater than or equal to 87%, the oxygen filling rate being given by an expression: ([atomic % of In]× 3/2+[atomic % of Ga]×3/2+[atomic % of Zn])/[atomic % of O].

With this configuration, in the thin film transistor substrate including the channel etch-type thin film transistor using the In-Ga-Zn-O-type oxide semiconductor layer, the ratio of In:Ga:Zn in atomic % in the oxide semiconductor layer is 1:1:1 or 4:5:1, and the oxygen filling rate of the oxide semiconductor layer is greater than or equal to 87%. This means that the oxygen deficiencies in the oxide semiconductor layer caused in forming the source electrode and the drain electrode are repaired. Therefore, it is possible to stably obtain satisfactory characteristics of channel etch-type TFTs using oxide semiconductor layers.

Advantages of the Invention

In the present invention, an steam annealing process is performed on an In—Ga—Zn—O-based oxide semiconductor layer having a predetermined composition, so that it is possible to stably obtain satisfactory characteristics of channel etch-type TFTs using oxide semiconductor layers.

BRIEF DESCRIPTION OF THE DRAWINGS

FIG. 5 is a graph illustrating drain current versus gate voltage characteristics of a first example.

FIG. 6 is a graph illustrating drain current versus gate voltage characteristics of a second example.

DESCRIPTION OF EMBODIMENTS

Embodiments of the present invention will be described in detail below with reference to the drawings. The present invention is not limited to the embodiments below.

<<First Embodiment of Invention>>

Figure 1:
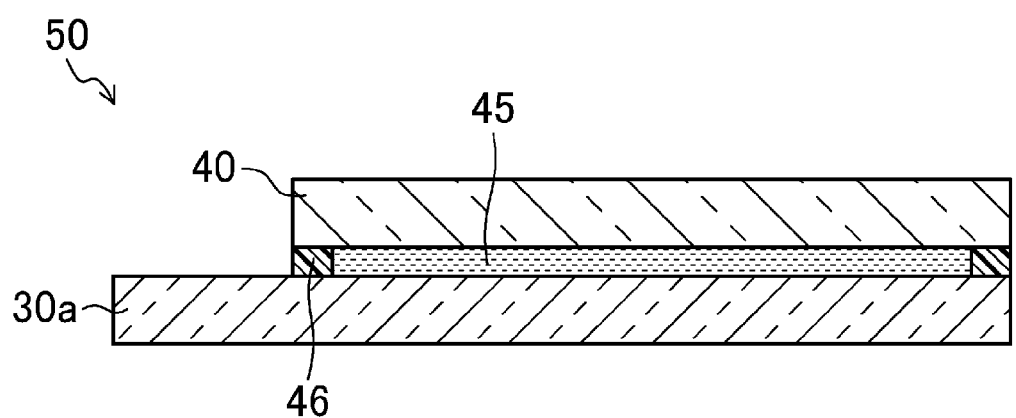
FIG. 1 is a cross-sectional view illustrating a liquid crystal display panel including a TFT substrate according to a first embodiment.
Figure 2A:
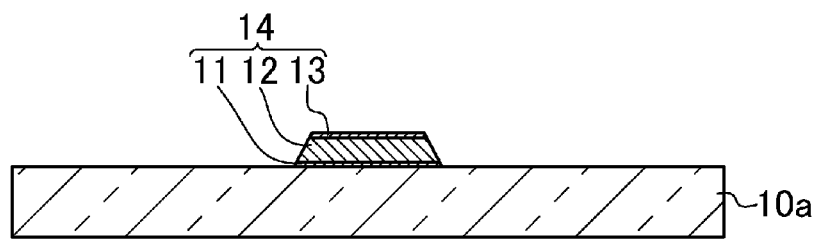
FIGS. 2A-2C are cross-sectional views illustrating the first half of fabrication steps of the TFT substrate according to the first embodiment.
Figure 2B:
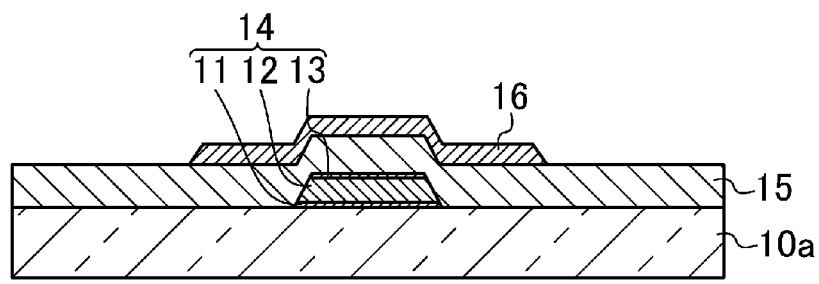
Figure 2C:
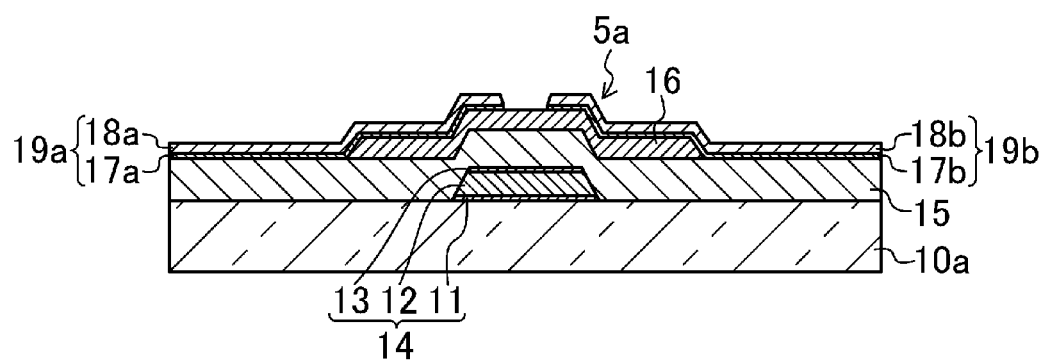
Figure 3A:
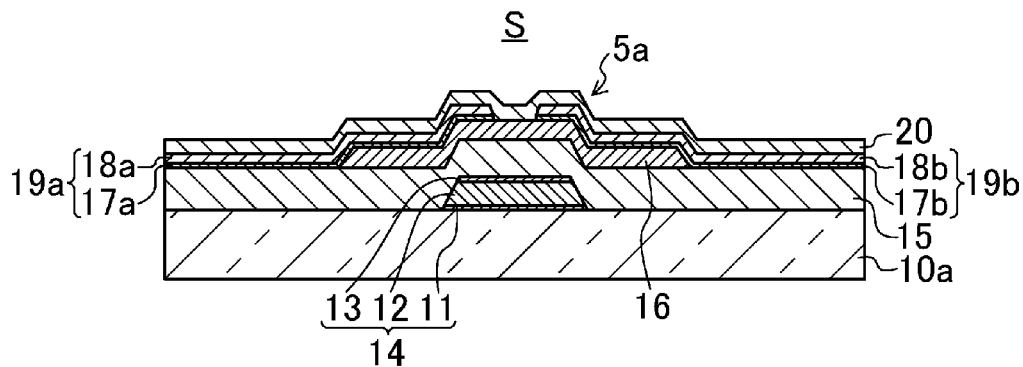
FIGS. 3A-3C are cross-sectional views illustrating the latter half of the fabrication steps of the TFT substrate according to the first embodiment.
Figure 3B:
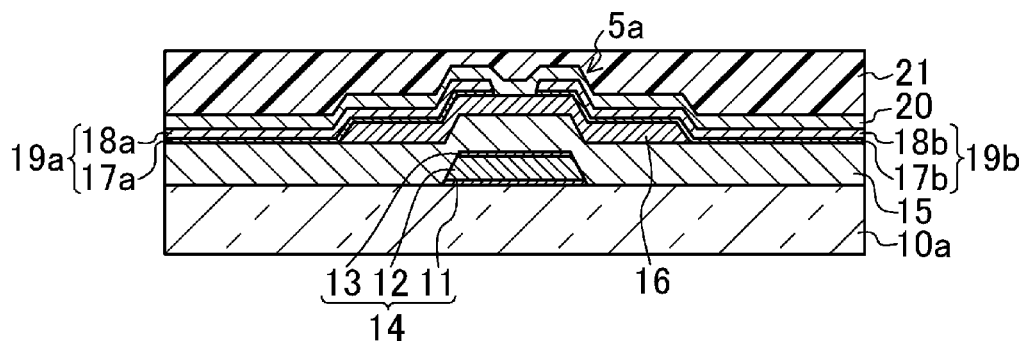
Figure 3C:
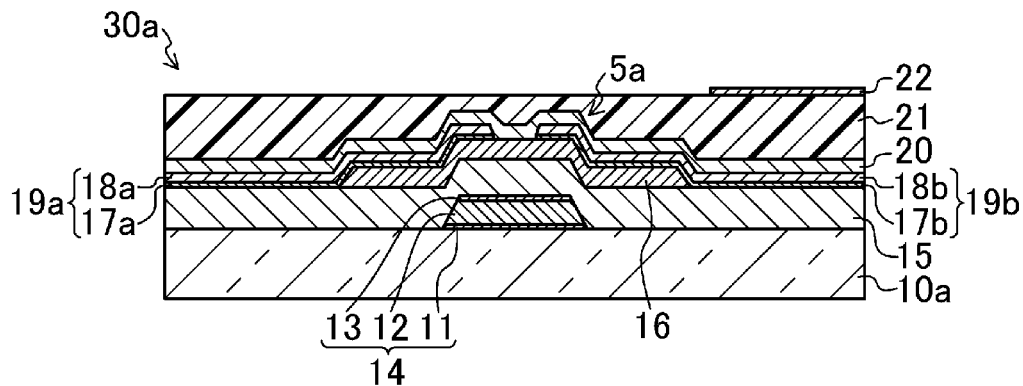
Figure 4A:
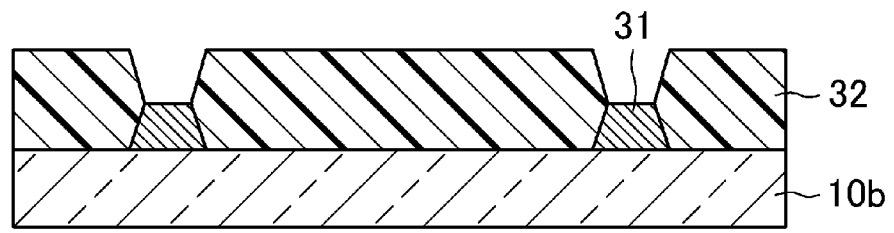
FIGS. 4A-4C are cross sectional views illustrating fabrication steps of a counter substrate provided to face the TFT substrate according to the first embodiment.
Figure 4B:
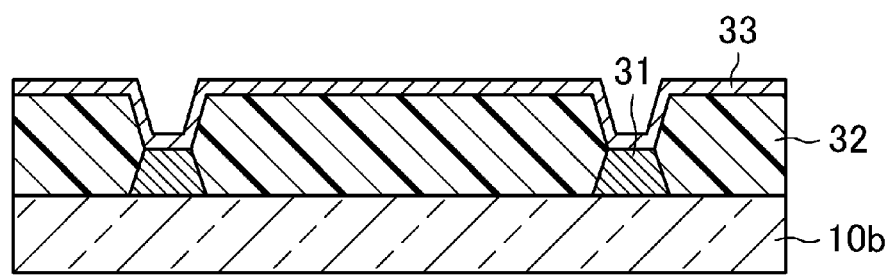
Figure 4C:
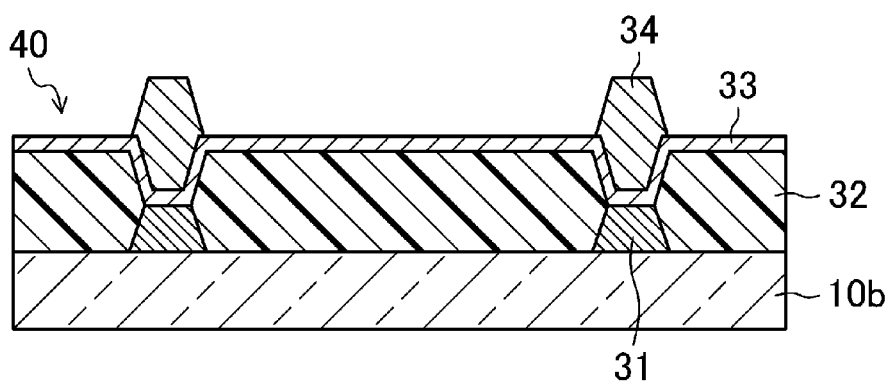

FIGS. 1, 2A-2C, 3A-3C, 4A-4C, 5, 6 are views illustrating a first embodiment of a TFT substrate according to the present invention and a method for fabricating the same. Specifically, FIG. 1 is a cross-sectional view illustrating a liquid crystal display panel 50 including a TFT substrate 30a of the present embodiment. FIGS. 2A-2C and FIGS. 3A-3C are cross-sectional views illustrating fabrication steps of the TFT substrate 30a. FIGS. 4A-4C are cross-sectional views illustrating fabrication steps of a counter substrate 40 disposed to face the TFT substrate 30a.

As illustrated in FIG. 1, the liquid crystal display panel 50 includes the TFT substrate 30a and the counter substrate 40 which are provided to face each other, a liquid crystal layer 45 provided between the TFT substrate 30a and the counter substrate 40, and a sealing material 46 which adheres the TFT substrate 30a to the counter substrate 40, and is provided to have a frame shape to seal the liquid crystal layer 45 between the TFT substrate 30a and the counter substrate 40.

As illustrated in FIG. 3C, the TFT substrate 30a includes an insulating substrate 10a, a plurality of gate lines (not shown) provided on the insulating substrate 10a to extend parallel to each other, a plurality of source lines (not shown) provided to extend parallel to each other in a direction orthogonal to the gate lines, a plurality of TFTs 5a each of which is provided at an associated one of crossing points of the gate lines and the source lines, that is, at an associated one of pixels, a protective film 20 provided to cover the TFTs 5a, an interlayer insulating film 21 provided to cover the protective film 20, a plurality of pixel electrodes 22 provided on the interlayer insulating film 21 in a matrix pattern, and an alignment layer (not shown) provided to cover the pixel electrodes 22.

As illustrated in FIG. 3C, each TFT 5a includes a gate electrode 14 provided on the insulating substrate 10a, a gate insulating film 15 provided to cover the gate electrode 14, an oxide semiconductor layer 16 provided on the gate insulating film 15 to overlap the gate electrode 14 in an island-like pattern, and a source electrode 19a and a drain electrode 19b provided on the semiconductor layer 16 to overlap the gate electrode 14 and to face each other.

The gate electrode 14 is, for example, laterally extending part of each gate line.

The oxide semiconductor layer 16 is an In—Ga—Zn—O-based layer, where the ratio of In:Ga:Zn in atomic % is 1:1:1 or 4:5:1. The oxygen filling rate of the oxide semiconductor layer 16 is greater than or equal to 87% and less than or equal to 95%. Note that the oxygen filling rate of the oxide semiconductor layer 16 is 100% in the case of no oxygen vacancy.

The source electrode 19a is, for example, laterally extending part of each source line.

The drain electrode 19b is connected to the pixel electrode 22 via a contact hole (not shown) formed in a multilayer film composed of the protective film 20 and the interlayer insulating film 21.

As illustrated in FIG. 4C, the counter substrate 40 includes an insulating substrate 10b, a black matrix 31 provided on the insulating substrate 10b in a lattice pattern, a color filter layer including colored layers 32, such as red layers, green layers, and blue layers provided between grid lines of the black matrix 31, a common electrode 33 provided to cover the color filter layer, a photo spacer 34 provided on the common electrode 33, and an alignment layer (not shown) provided to cover the common electrode 33.

The liquid crystal layer 45 is made of, for example, a nematic liquid crystal material having electro-optical characteristics.

In the liquid crystal display panel 50 having the above-described configuration, a voltage predetermined for each pixel is applied to the liquid crystal layer 45 provided between each pixel electrode 22 on the TFT substrate 30a and the common electrode 33 on the counter substrate 40 so that alignment of the liquid crystal layer 45 is changed, thereby adjusting transmittance of light penetrating through the panel for each pixel to display an image.

Next, a method for fabricating the liquid crystal display panel 50 of the present embodiment will be described with reference to FIGS. 2A-2C, FIGS. 3A-3C, and FIGS. 4A-4C. Note that the fabrication method of the present embodiment includes: a TFT substrate fabrication step including a gate formation step, an oxide semiconductor layer formation step, a source/drain formation step, a protective film formation step, and a steam annealing step; a counter substrate fabrication step; and a liquid crystal injection step.

<TFT Substrate Fabrication Step>

First, on the entire surface of an insulating substrate 10a such as a glass substrate, for example, a titanium film (thickness: about 30 nm-150 nm), an aluminum film (thickness: about 200 nm-500 nm), a titanium film (thickness: about 30 nm-150 nm), etc. are sequentially formed by sputtering. Then, a multilayer film composed of the titanium film, the aluminum film, and the titanium film is subjected to photolithography, wet etching, resist removed, and cleaning, thereby forming, as illustrated in FIG. 2A, a gate electrode 14 composed of a titanium layer 11, an aluminum layer 12, and a titanium layer 13, and a gate line (gate layer formation step).

Subsequently, on the entire surface of the substrate provided with the gate electrode 14 and the gate line, for example, a silicon oxide film (thickness: about 200 nm-500 nm), etc. is formed by CVD, thereby forming a gate insulating film 15. Then, an In—Ga—Zn—O-based oxide semiconductor film (thickness: about 10 nm-300 nm) is formed by sputtering at 100° C.-450° C., or higher, and the oxide semiconductor film is subjected to photolithography, wet etching, resist removed, and cleaning, thereby forming, as illustrated in FIG. 2B, an oxide semiconductor layer 16 (oxide semiconductor layer formation step).

Then, on the entire surface of the substrate provided with the oxide semiconductor layer 16, for example, a titanium film (thickness: about 30 nm-150 nm), an aluminum film (thickness: about 50 nm-400 nm), etc. are sequentially formed by sputtering. Then, a multilayer film composed of the titanium film and the aluminum film is subjected to photolithography, wet etching, resist removed, and cleaning, thereby forming, as illustrated in FIG. 2C, a source electrode 19*a* composed of a titanium layer 17*a* and an aluminum layer 18*a*, a drain electrode 19*b* composed of a titanium layer 17*b* and an aluminum layer 18*b*, a source line, and a TFT 5*a* (source/drain formation step).

Subsequently, on the entire surface of the substrate provided with the TFT 5*a*, for example, a silicon oxide film (thickness: about 100 nm-700 nm), etc. is formed by, for example, CVD, thereby forming a protective film 20 (see, FIG. 3A) (protective film formation step).

Then, as illustrated in FIG. 3A, by using a steam anneal chamber, an annealing process is performed on the substrate provided with the protective film 20 by using oxygen gas as carrier gas in an atmosphere containing steam S at about 100° C.-450° C. under atmospheric pressure, thereby performing a steam annealing process (steam annealing step).

Then, for example, to the entire surface of the substrate after the steam annealing process, acrylic photosensitive resin is applied by spin coating to have a thickness of about 2 μm. A film made of the applied acrylic photosensitive resin is patterned by photolithography, thereby forming an interlayer insulating film 21 as illustrated in FIG. 3B, and then, the protective film 20 exposed from the interlayer insulating film 21 is etched by dry etching, thereby forming a contact hole on the drain electrode 19*b*.

Finally, on the entire surface of the substrate provided with the contact hole, a transparent conductive film such as, for example, an indium tin oxide (ITO) film (thickness: about 50 nm-200 nm) is formed by sputtering. The transparent conductive film is subjected to photolithography, wet etching, resist removed, and cleaning, thereby forming, as illustrated in FIG. 3C, a pixel electrode 22.

Through the foregoing steps, a TFT substrate 30*a* can be fabricated.

<Counter Substrate Fabrication Step>

First, to the entire surface of an insulating substrate 10*b* such as a glass substrate, for example, black colored photosensitive resin is applied by spin coating or slit coating. Then, a film made of the applied photosensitive resin is exposed to light and developed, thereby forming a black matrix 31 (see FIG. 4A) to have a thickness of about 1.0 μm.

Subsequently, to the entire surface of the substrate provided with the black matrix 31, for example, red, green, or blue colored photosensitive resin is applied by spin coating or slit coating. Then, a film made of the applied photosensitive resin is exposed to light and developed, thereby forming, as illustrated in FIG. 4A, a colored layer 32 colored a selected color (e.g., a red layer) to have a thickness of about 2.0 μm. Then, for the other two colors, a similar step is repeated to form colored layers 32 colored the other two colors (e.g., green and blue layers) each having a thickness of about 2.0 μm.

Then, on the substrate provided with the colored layers 32 colored red, green, and blue, for example, a transparent conductive film such as an ITO film is deposited by sputtering, thereby forming, as illustrated in FIG. 4B, a common electrode 33 to have a thickness of about 50 nm-200 nm Finally, to the entire surface of the substrate provided with the common electrode 33, photosensitive resin is applied by spin coating or slit coating. Then, a film made of the applied photosensitive resin is exposed to light and developed, thereby forming, as illustrated in FIG. 4C, a photo spacer 34 to have a thickness of about 4 μm.

Through the foregoing step, a counter substrate 40 can be fabricated.

<Liquid Crystal Injection Step>

First, to each of a surface of the TFT substrate 30a fabricated in the TFT substrate fabrication step and a surface of the counter substrate 40 fabricated in the counter substrate fabrication step, a resin film made of polyimide is formed by printing. Then, the formed resin film is baked and subjected to a rubbing process, thereby forming an alignment layer.

Subsequently, for example, on the surface of the counter substrate 40 provided with the alignment layer, a sealing material 46 made of, for example, ultraviolet (UV) and thermal curing resin is printed in a frame shape. Then, a liquid crystal material is dropped into an inner region surrounded by the sealing material 46.

Then, the counter substrate 40 provided with the liquid crystal material is bonded to the TFT substrate 30a provided with the alignment layer under reduced pressure. Then, the bonded assembly is released to the atmospheric pressure, thereby pressurizing a front surface and a rear surface of the bonded assembly.

Then, the sealing material 46 held between the TFT substrate 30a and the counter substrate 40 forming the bonded assembly is irradiated with UV light. Then, the bonded assembly is heated to cure the sealing material 46.

Finally, the bonded assembly having the cured sealing material 46 is divided by, for example, dicing, thereby removing its unnecessary portions.

Through the foregoing step, a liquid crystal display panel 50 of the present embodiment can be fabricated.

Figure 8:
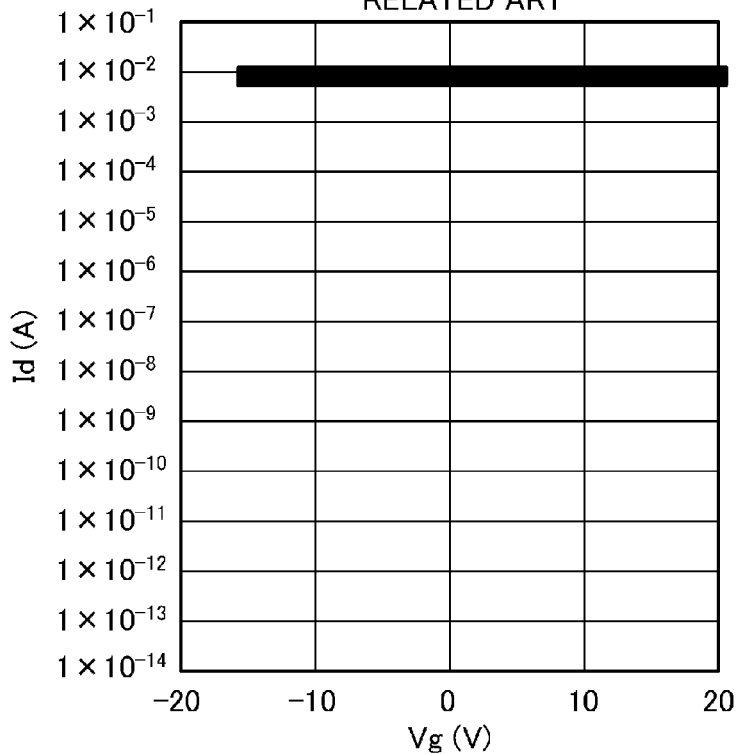
FIG. 8 is a graph illustrating drain current versus gate voltage characteristics of a first comparative example.
Figure 9:
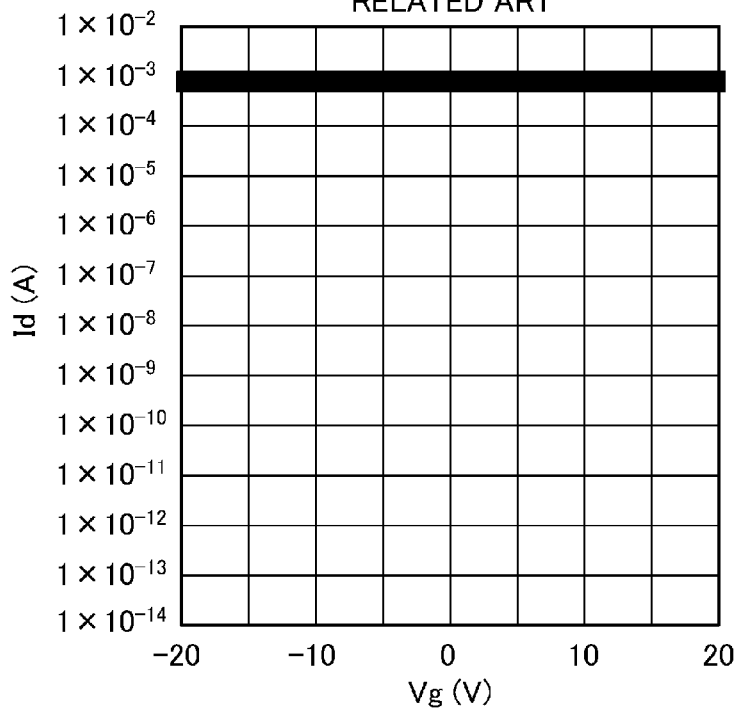
FIG. 9 is a graph illustrating drain current versus gate voltage characteristics of a second comparative example.
Figure 10:
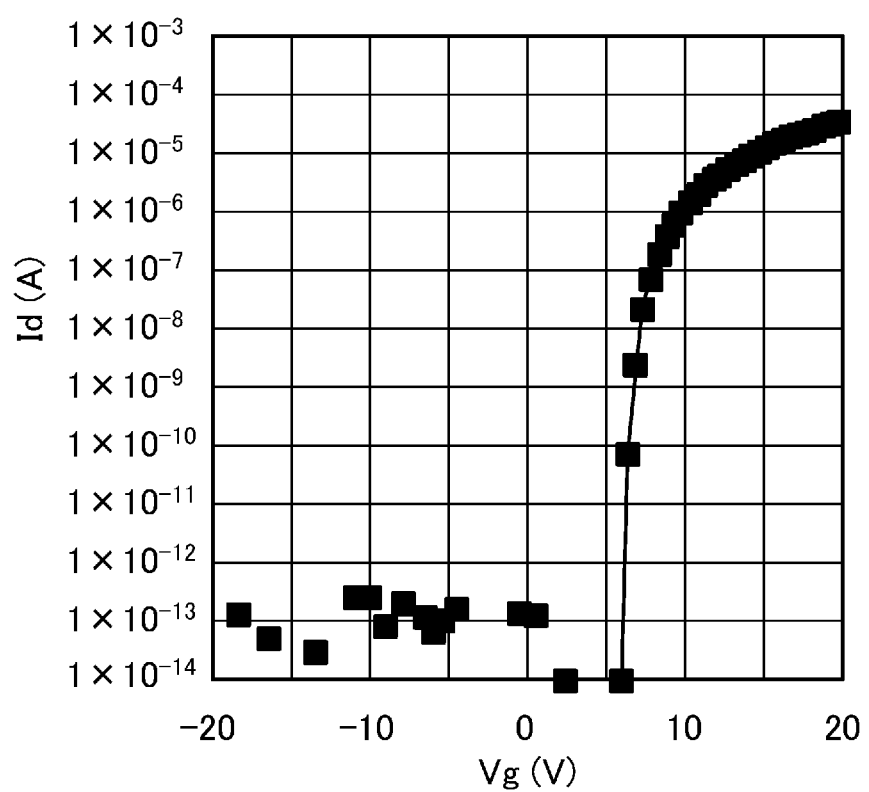
FIG. 10 is a graph illustrating drain current versus gate voltage characteristics of a third comparative example.

Next, specifically performed experiments will be described. Here, FIG. 5 and FIG. 6 are graphs illustrating drain current (Id) versus gate voltage (Vg) characteristics respectively of a first example and a second example. FIG. 8, FIG. 9, and FIG. 10 are graphs illustrating drain current (Id) versus gate voltage (Vg) characteristics respectively of a first comparative example, a second comparative example, and a third comparative example.

Specifically, first, as the first example of the present invention, an In—Ga—Zn—O-based oxide semiconductor layer in which the ratio of In:Ga:Zn in atomic % is 1:1:1 was used, and a steam annealing process was performed at 350° C. for 3 hours in a manner similar to that of the above-described embodiment, thereby fabricating a TFT substrate, and characteristics of a TFT of the TFT substrate were evaluated. As the first comparative example of the present invention, an In—Ga—Zn—O-based oxide semiconductor layer in which the ratio of In:Ga:Zn in atomic % is 1:1:1 was used, and an annealing process was performed at 350° C. for 1 hour in the air, thereby forming a TFT substrate, and characteristics of a TFT of the TFT substrate were evaluated.

As illustrated in FIG. 5, in the first example, a satisfactory on/off current ratio can be ensured, and satisfactory characteristics, low off currents, are exhibited. In contrast, as illustrated in FIG. 8, in the first comparative example, conductor-like characteristics in which no on/off current ratio can be ensured are exhibited.

Table 1 below shows results of evaluation of TFT substrates fabricated by using In—Ga—Zn—O-based oxide semiconductor layers in which the ratio of In:Ga:Zn in atomic % is 1:1:1 similar to the first example, and performing steam annealing under various process conditions (annealing time/annealing temperature). Table 2 below shows results of evaluation of TFT substrates fabricated by using In—Ga—Zn—O-based oxide semiconductor layers in which the ratio of In:Ga:Zn in atomic % is 1:1:1 similar to the first comparative example, and performing annealing in the air under various process conditions (annealing time/annealing temperature). Here, in Table 1 and Table 2, "white circle" means that the TFT has drain current to gate voltage characteristics as illustrated in FIG. 5, "cross" means that the TFT has drain current to gate voltage characteristics as illustrated in FIGS. 8, and "white triangle" means that the TFT has drain current to gate voltage characteristics which are intermediate characteristics between those of FIG. 5 and FIG. 8, where part of the curve of the drain current to gate voltage characteristics of FIG. 8 corresponding to an off current is slightly lowered.

TABLE 1

|  |  | Annealing Temperature (° C.) | | |
|---|---|---|---|---|
|  |  | 250 | 350 | 450 |
| Time | 1 h | X (80%) | Δ (85%) | ○ (90%) |
|  | 2 h | X (80%) | Δ (85%) | Δ (97%) |
|  | 3 h | X (80%) | ○ (90%) | Δ (105%) |

TABLE 2

|  |  | Annealing Temperature (° C.) | | |
|---|---|---|---|---|
|  |  | 250 | 350 | 450 |
| Time | 1 h | X (80%) | X (80%) | X (80%) |
|  | 2 h | X (80%) | X (80%) | X (80%) |
|  | 3 h | X (80%) | X (80%) | Δ (85%) |

Values in the brackets in Table 1 are oxygen filling rates of the oxide semiconductor layers after the steam annealing process. Here, the oxygen filling rates were computed based on the expression: [atomic % of In]×3/2+[atomic % of Ga]×× 3/2+[atomic % of Zn])/[atomic % of O], where the composition ratio of the elements was computed by performing elementary analysis using the Auger analyzer described below under its conditions of use. Note that values in the brackets in Table 2 show oxygen filling rates of the oxide semiconductor layers after the annealing process in the air.

Device Used: JAMP-9500F manufactured by JEOL Ltd.
Electron Beam Irradiation Conditions: 5 kV, 5 nA, sample inclined at 75 degrees
Neutralization Conditions: Ar ion, 10 eV, 1 μA
Analysis Area: 1 μm×7 μm rectangular area
Detector Energy Resolution: dE/E=0.35%
Detected Energy Step: 1.0 eV
Detection Peak: In, Ga, Zn, O, Si Note that Auger electrons are only part of a large amount of detected electrons, and are significantly influenced by a background. Thus, as is generally performed in the art, a background of a low-frequency component was removed by differentiating a spectrum, and then the composition ratio of the elements was computed from peak intensity of each element by using a sensitivity coefficient specific to the element (values of pure elements included with the device).

Moreover, the composition ratio of In (pure metal) and In ($In_2O_3$) was computed by performing fitting by a nonnegative least squares method at standard measuring peaks of In (pure metal) and In ($In_2O_3$) to split a differential spectrum of In obtained by the Auger analysis in components, and by using the sensitivity coefficient.

As can be seen from Table 1 and Table 2, in the annealing process in the air, off currents were finally slightly reduced after processing at 450° C. for 3 hours. In contrast, in the steam annealing process, a TFT having satisfactory characteristics can be obtained after processing at 350° C. for 3 hours or at 450° C. for 1 hour.

Next, as the second example of the present invention, an In—Ga—Zn—O-based oxide semiconductor layer in which the ratio of In:Ga:Zn in atomic % is 4:5:1 was used, and a steam annealing process was performed at 350° C. for 1 hour in a manner similar to the above-described embodiment, thereby fabricating a TFT substrate, and characteristics of a TFT of the TFT substrate were evaluated. As the second comparative example of the present invention, an In—Ga—Zn—O-based oxide semiconductor layer in which the ratio of In:Ga:Zn in atomic % is 4:5:1 was used, and an annealing process was performed in the air at 350° C. for 1 hour, thereby fabricating a TFT substrate, and characteristics of a TFT of the TFT substrate were evaluated.

As illustrated in FIG. 6, in the second example, a satisfactory on/off current ratio can be ensured, and satisfactory characteristics, low off currents are exhibited. In contrast, as illustrated in FIG. 9, in the second comparative example, conductor-like characteristics in which no on/off current ratio can be ensured are exhibited.

A type using an In—Ga—Zn—O-based oxide semiconductor layer in which the ratio of In:Ga:Zn in atomic % is 2:2:1 was considered. In this case, in contrast to the result of the 1:1:1 or 4:5:1 type described above, performing the annealing process in the air at 350° C. for 1 hour resulted in satisfactory characteristics of the TFT as illustrated in FIG. 10, whereas performing the steam annealing process resulted in unsatisfactory characteristics of the TFT. Thus, it was confirmed that the steam annealing process is not effective in all In—Ga—Zn—O-based oxide semiconductor layers, but depends on the composition of the oxide semiconductor layer.

As described above, according to the TFT substrate 30a of the present embodiment and the method for fabricating the same, in the oxide semiconductor layer formation step, the oxide semiconductor layer 16 in which the ratio of In:Ga:Zn in atomic % is 1:1:1 or 4:5:1 is formed, and then in the source/drain formation step, a surface layer of the oxide semiconductor layer 16 formed in the oxide semiconductor layer formation step is etched in performing channel etching to form the source electrode 19a and the drain electrode 19b, thereby causing desorption of oxygen of the channel region of the oxide semiconductor layer 16, which causes oxygen deficiencies. However, in the steam annealing step, an annealing process in an atmosphere containing steam S (a steam annealing process) is performed to supply oxygen to the channel region of the oxide semiconductor layer 16, so that it is possible to repair the oxygen deficiencies in the oxide semiconductor layer 16. Here, the steam annealing process has high oxidizing power than the annealing process in an air atmosphere, so that a low process temperature and/or a short processing time suffice(s), and it is also possible to reduce reduction reaction involving the oxygen deficiencies of the oxide semiconductor layer 16 due to the gate insulating film 15. Thus, the defect level due to the oxygen deficiencies in the oxide semiconductor layer 16 can be reduced, so that no hysteresis occurs in the channel etch-type TFT 5a using the oxide semiconductor layer 16, and thus satisfactory characteristics such as high mobility, high reliability, and low off currents can be stably obtained.

Moreover, according to the method for fabricating the TFT substrate 30a of the present embodiment, in the protective film formation step, the protective film 20 made of a silicon oxide film is formed to cover the oxide semiconductor layer 16 exposed from the source electrode 19a and the drain electrode 19b (channel region). Thus, oxygen of the channel region of the oxide semiconductor layer 16 may be desorbed by CVD in forming the protective film 20. However, after the protective film formation step, the steam annealing step is performed. Thus, the oxygen deficiencies in the oxide semiconductor layer 16 can be effectively repaired.

Moreover, according to the method for fabricating the TFT substrate 30a of the present embodiment, the gate insulating film 15 formed in the oxide semiconductor layer formation step is made of a silicon oxide film. Thus, for example, the oxygen deficiencies in the oxide semiconductor layer, which may be caused in the case of the silicon nitride film due to desorption of hydrogen in the silicon nitride film, can be reduced.

Moreover, according to the method for fabricating the TFT substrate 30a of the present embodiment, the steam annealing process is performed under atmospheric pressure, so that it is possible to reduce desorption of oxygen due to ambient pressure in performing the steam annealing process.

Moreover, according to the method for fabricating the TFT substrate 30a of the present embodiment, the steam annealing process is performed at a temperature lower than or equal to the film formation temperature of the oxide semiconductor layer. Thus, it is possible to reduce reduction reaction involving the oxygen deficiencies in the oxide semiconductor layer 16 due to the gate insulating film 15.

<<Second Embodiment of Invention°°

Figure 7:
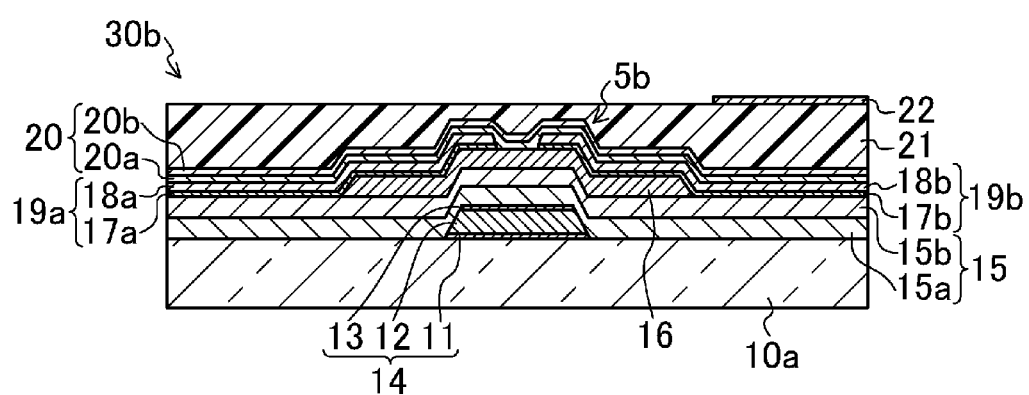
FIG. 7 is a cross-sectional view illustrating a TFT substrate according to a second embodiment.

FIG. 7 is a cross-sectional view illustrating a TFT substrate 30b of the present embodiment. In the embodiment below, the same reference numerals as those shown in FIGS. 1, 2A-2C, 3A-3C, 4A-4C, 5, 6 are used to represent equivalent elements, and the detailed explanation thereof will be omitted.

The first embodiment has illustrated the TFT substrate 30a including the gate insulating film and the protective film each have a single-layer structure, whereas the present embodiment will illustrate the TFT substrate 30b including a gate insulating film and a protective film each have a layered structure.

As illustrated in FIG. 7, the TFT substrate 30b is configured such that a gate insulating film 15 included in a TFT 5b includes a the silicon nitride film 15a and a silicon oxide film 15b provided on the silicon nitride film 15a, a protective film 20 covering the TFT 5b includes a silicon oxide film 20a and a silicon nitride film 20b provided on the silicon oxide film 20a, and the other components are substantially the same as those of the TFT substrate 30a of the first embodiment.

The TFT substrate 30b having the above-described configuration can be fabricated by only adding a step of forming a silicon nitride film to the step of forming the silicon oxide film in forming the gate insulating film and the protective film of the fabrication method described in the first embodiment.

According to the TFT substrate 30b of the present embodiment and a method for fabricating the same, a steam annealing process is performed, in a manner similar to that of the first embodiment, on an In—Ga—Zn—O-based oxide semiconductor layer 16 having a predetermined composition. Thus, no hysteresis occurs in the channel etch-type TFT 5b using the oxide semiconductor layer 16, and it is possible to stably obtain satisfactory characteristics such as high mobility, high reliability, and low off currents.

Moreover, according to the method for fabricating the TFT substrate 30b of the present embodiment, part of the gate insulating film 15 and part of the protective film 20 facing the oxide semiconductor layer 16 are made of the silicon oxide films. Thus, for example, the oxygen deficiencies in the oxide semiconductor layer, which may be caused in the case of the silicon nitride film due to desorption of hydrogen in the silicon nitride film, can be reduced.

Although each of the embodiments has illustrated the TFT substrate in which the electrode of the TFT connected to the pixel electrode serves as the drain electrode, the present invention is also applicable to TFT substrates in which electrodes of TFTs connected to pixel electrodes are referred to as source electrodes.

Although each of the embodiments has illustrated the In—Ga—Zn—O-based oxide semiconductor layer, the present invention is applicable to In—Si—Zn—O-based oxide semiconductor layers, In—Al—Zn—O-based oxide semiconductor layers, Sn—Si—Zn—O-based oxide semiconductor layers, Sn—Al—Zn—O-based oxide semiconductor layers, Sn—Ga—Zn—O-based oxide semiconductor layers, Ga—Si—Zn—O-based oxide semiconductor layers, Ga—Al—Zn—O-based oxide semiconductor layers, In—Cu—Zn—O-based oxide semiconductor layers, Sn—Cu—Zn—O-based oxide semiconductor layers, Zn—O-based oxide semiconductor layers, In—O-based oxide semiconductor layers, etc.

Although each of the embodiments has illustrated the TFT substrate in which a capacitor line forming storage capacitor is not provided to each pixel, the present invention is also applicable to TFT substrates in which capacitor lines forming storage capacitor are each provided to a pixel.

Industrial Applicability

As described above, the present invention stably provides satisfactory characteristics to the channel etch-type TFT using the oxide semiconductor layer, and thus is useful for TFT substrates included in various display panels such as liquid crystal display panels, organic electro luminescence (EL) display panels, or the like.

DESCRIPTION OF REFERENCE CHARACTERS

S Steam
5a, 5b TFT
10a Insulating Substrate
14 Gate Electrode
15 Gate Insulating Film
16 Oxide Semiconductor Layer
19a Source Electrode
19b Drain Electrode
20 Protective Film
30a, 30b TFT Substrate The invention clamed is:
1. A method for fabricating a thin film transistor substrate, the method comprising:
a gate formation step of forming a gate electrode on a substrate;
an oxide semiconductor layer formation step of forming a gate insulating film to cover the gate electrode, and then forming an In—Ga—Zn—O-based oxide semiconductor layer on the gate insulating film to overlap the gate electrode; and a source/drain formation step of forming a source electrode and a drain electrode on the oxide semiconductor layer to overlap the gate electrode and to face each other, wherein in the oxide semiconductor layer formation step, the oxide semiconductor layer in which a ratio of In:Ga:Zn in atomic % is 1:1:1 or 4:5:1 is formed, the method further includes, after the source/drain formation step, a steam annealing step of performing an annealing process in an atmosphere containing steam on the substrate provided with the source electrode and the drain electrode, and the steam annealing step is performed at a temperature lower than or equal to a film formation temperature of the oxide semiconductor layer.

2. The method of claim 1, further comprising a protective film formation step of forming a protective film to cover the oxide semiconductor layer exposed from the source electrode and the drain electrode, wherein at least part of the protective film facing the oxide semiconductor layer is made of a silicon oxide film, and the steam annealing step is performed after the protective film formation step.

3. The method of claim 1, wherein in the oxide semiconductor layer formation step, at least part of the gate insulating film facing the oxide semiconductor layer is made of a silicon oxide film.

4. The method of claim 1, wherein the steam annealing step is performed under atmospheric pressure.

5. A method for fabricating a thin film transistor substrate, the method comprising:

a gate formation step of forming a gate electrode on a substrate;

an oxide semiconductor layer formation step of forming a gate insulating film to cover the gate electrode, and then forming an In—Ga—Zn—O-based oxide semiconductor layer on the gate insulating film to overlap the gate electrode; and a source/drain formation step of forming a source electrode and a drain electrode on the oxide semiconductor layer to overlap the gate electrode and to face each other, wherein in the oxide semiconductor layer formation step, the oxide semiconductor layer in which a ratio of In:Ga:Zn in atomic % is 1:1:1 or 4:5:1 is formed, the method further includes, after the source/drain formation step, a steam annealing step of performing an annealing process in an atmosphere containing steam on the substrate provided with the source electrode and the drain electrode, and in the steam annealing step, the annealing process is performed such that an oxygen filling rate of the oxide semiconductor layer is greater than or equal to 87%, the oxygen filling rate being given by an expression: ([atomic % of In]×3/2 +[atomic % of Ga]×3/2 +[atomic % of Zn])/[atomic % of O].

6. The method of claim 5, further comprising a protective film formation step of forming a protective film to cover the oxide semiconductor layer exposed from the source electrode and the drain electrode, wherein at least part of the protective film facing the oxide semiconductor layer is made of a silicon oxide film, and the steam annealing step is performed after the protective film formation step.

7. The method of claim 5, wherein in the oxide semiconductor layer formation step, at least part of the gate insulating film facing the oxide semiconductor layer is made of a silicon oxide film.

8. The method of claim 5, wherein the steam annealing step is performed under atmospheric pressure.

* * * * *